(12) United States Patent
Cheung et al.

(10) Patent No.: US 11,258,431 B2
(45) Date of Patent: Feb. 22, 2022

(54) METHOD AND APPARATUS FOR IMPLEMENTING A SUPER SAMPLE RATE OVERSAMPLING CHANNELIZER

(71) Applicant: Intel Corporation, Santa Clara, CA (US)

(72) Inventors: Colman Cheung, San Diego, CA (US); Gregory Nash, Barrington, IL (US)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 16/104,064

(22) Filed: Aug. 16, 2018

(65) Prior Publication Data

US 2020/0059222 A1  Feb. 20, 2020

(51) Int. Cl.
*H03H 17/02* (2006.01)
*G06F 17/16* (2006.01)

(52) U.S. Cl.
CPC ......... *H03H 17/0275* (2013.01); *G06F 17/16* (2013.01); *H03H 17/0267* (2013.01)

(58) Field of Classification Search
CPC .................. H03H 17/0267; H03H 17/0275
See application file for complete search history.

(56) References Cited

U.S. PATENT DOCUMENTS

| 2004/0042557 A1* | 3/2004 | Kabel | H04B 1/406 375/260 |
| 2005/0276335 A1* | 12/2005 | Kumar | H03H 17/0213 375/260 |
| 2014/0169501 A1* | 6/2014 | Nazarathy | H04L 27/2652 375/316 |

OTHER PUBLICATIONS

Intel, "Versatile Channelizer with DSP Builder for Intel FPGAs", pp. 1-10. (Year: 2017).*

* cited by examiner

*Primary Examiner* — Chuong D Ngo

(57) ABSTRACT

An oversampling channelizer for processing overlapping data that includes a data storage unit, coupled to a data line that receives data values. The data storage unit includes a plurality of lanes, wherein each of the plurality of lanes includes dedicated memory locations and wires that store and transmit data values for a data vector of a data frame, and that store and transmit additional data values for a subsequent data vector of a subsequent data frame that includes a plurality of the data values from the data vector in the data frame. The oversampling channelizer includes a coefficient storage unit that stores a plurality of coefficient vectors for a plurality of coefficient frames. The oversampling channelizer includes a computation unit that computes a dot product of the data values for the data vectors of the data frame with coefficient values for coefficient vectors of a coefficient frame selected by a coefficient storage unit.

20 Claims, 14 Drawing Sheets

METHOD AND APPARATUS FOR IMPLEMENTING A SUPER SAMPLE RATE OVERSAMPLING CHANNELIZER

FIELD

Embodiments of the present disclosure relate to digital signal processing. More specifically, embodiments of the present disclosure relate to a method and apparatus for implementing a super sample rate oversampling channelizer on a field programmable gate array.

BACKGROUND

The use of digital polyphase filter banks in modern signal processing systems has increased dramatically over recent years. This increased use stems from a desire to deliver more capable, innovative, and accessible systems while sharing a common physical infrastructure. This is especially true when strict regulations on Radio Frequency (RF) spectrum use result in spectrum congestion. Approaches have been taken to leverage hardware platforms that deliver greater processing bandwidth to compensate for different adverse effects that become evident at higher frequencies.

Today's state of the art systems use high RFs that operate using millimeter length waves. This expansion enables many unoccupied bands that system engineers can leverage to expand the operational bandwidth of their systems without interference. The ability to expand the operational bandwidth provides an opportunity to expand usage and features for several RF applications. This is applicable to communication systems that use wideband to provide higher data rates over the channel as defined by Shannon's Theorem.

Shannon's channel capacity theorem dictates that if a system uses higher bandwidth, it is possible to operate in much lower signal-to-noise ratio (SNR) specifications that results in a lower transmit power density. For communications system, this translates to lower probability of intercept or jamming while also allowing these systems to have better resilience to a multi-path effect by operating with a shorter pulse duration for transmitted bits. Modern radar systems also benefit from the ability to operate at wider bandwidths by increasing resolution and the ability to discriminate two adjacent range reflections. Synthetic aperture radar (SAR) requires extremely wide bandwidths of the waveform to acquire terrain images with resolution of inches.

BRIEF DESCRIPTION OF THE DRAWINGS

The features and advantages of embodiments of the present disclosure are illustrated by way of example and are not intended to limit the scope of the embodiments of the present disclosure to the particular embodiments shown.

DETAILED DESCRIPTION

In the following description, for purposes of explanation, specific nomenclature is set forth to provide a thorough understanding of embodiments of the present disclosure. It will be apparent to one skilled in the art that specific details in the description may not be required to practice the embodiments of the present disclosure. In other instances, well-known circuits, devices, procedures, and programs are shown in block diagram form to avoid obscuring embodiments of the present disclosure unnecessarily.

A channelizer, also referred to as an analysis filter bank, takes a signal with certain bandwidth and divides it into several narrow band signals. Each output band or channel is a baseband signal itself. A channelizer achieves its goal by modulating (frequency shifting) the band of interest to baseband, filtering out unwanted bands, and decimating the band to a narrow band signal. Alternatively, the band of interest may be band-passed first with a complex filter, modulated to the baseband, and then decimated to a narrow band signal.

Figure 1:
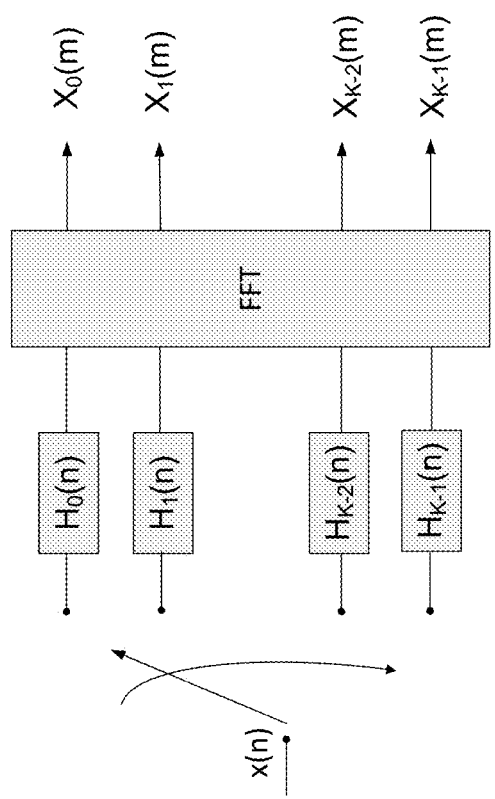
FIG. 1 illustrates a block diagram of a polyphase filter and fast Fourier transform channelizer according to an exemplary embodiment of the present disclosure.

FIG. 1 illustrates a block diagram of a polyphase filter and fast Fourier transform channelizer according to an exemplary embodiment of the present disclosure. Instead of extracting each channel individually, all channels may be extracted efficiently using a polyphase filter bank (PFB) and a fast Fourier transform (FFT). In this example, K represents the total number of channels and k represents the channel index range from 0 to K−1. T represents the number of taps of coefficients per phase. The overall filter has K*T number of coefficients.

Figure 2:
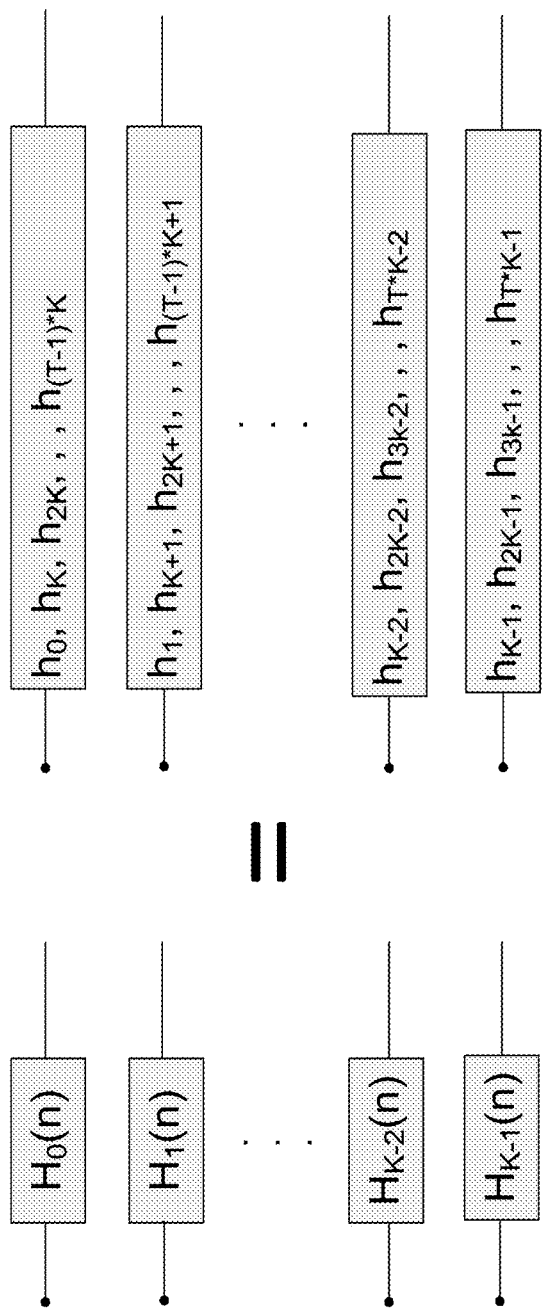
FIG. 2 illustrates the formation of polyphase filter coefficients according to an exemplary embodiment of the present disclosure.

FIG. 2 illustrates the formation of polyphase filter coefficients according to an exemplary embodiment of the present disclosure. A polyphase filter may be formed by breaking down a prototype low pass filter into K sub-filters across K groups. For example, a prototype filter with taps

[h0, h1, ... hT*(K−1)], can be arranged as K sub-filters. The K sub-filters still posses the characteristics of the original prototype low pass filter, but is down sampled by K, and separated phase-wise by 2 π/K. In this example, H(n) is a low pass filter meeting a channelizer requirements in terms of transition bandwidth and signal to noise ratio.

A selector, illustrated on the left side of FIG. 1, down samples an input by K:1 into each sub-filter. At the output of the polyphase filter, there are K down sampled outputs with different phase information. The amount of information at the input and output of the polyphase filter has not changed, but transformed and bandwidth limited per the polyphase filter design.

Figure 3:
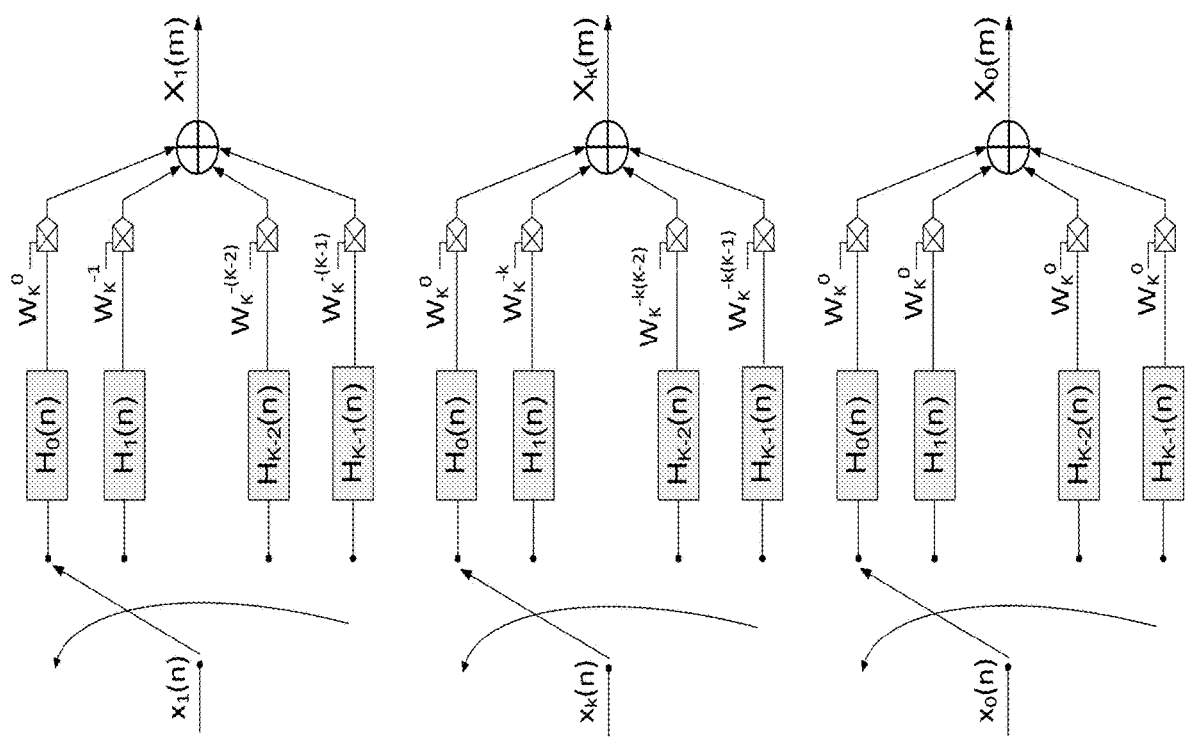
FIG. 3 illustrates a polyphase filter bank channelizer for channel 0, 1, and k according to an exemplary embodiment of the present disclosure.

FIG. 3 illustrates a polyphase filter bank channelizer for channel 0, 1, and k according to an exemplary embodiment of the present disclosure. When the outputs of the polyphase filter are summed, only the channel at the baseband ($0^{th}$ channel, k=0) is preserved as shown at the top left of FIG. 3. Information on all the other channels are destructively canceled out. If each phase, p, of the polyphase filter bank output are spun by $W_K^{-p}$ before being summed, then the next (k=1) channel is extracted to the base band as shown in the top right of FIG. 3. If the output of the polyphase filter bank phase are spun by $W_K^{-kp}$ before being summed, then the $k^{th}$ channel is extracted to the base band as shown at the bottom of FIG. 3.

The output $X_0(m)$, $X_1(m)$, and $X_k(m)$ are the $0^{th}$ $1^{st}$, and $k^{th}$ output of a regular discrete Fourier transform (DFT) or FFT. The FFT efficiently modulates all the polyphase filter bank phase outputs into individual base band signals. The amount of computation for modulation is reduced from $K^2$ to $K(\log_2 K)$. It should be appreciated that the FFT operation does not pertain to time and frequency conversion, but is used to implement frequency spinners W.

Figure 4:
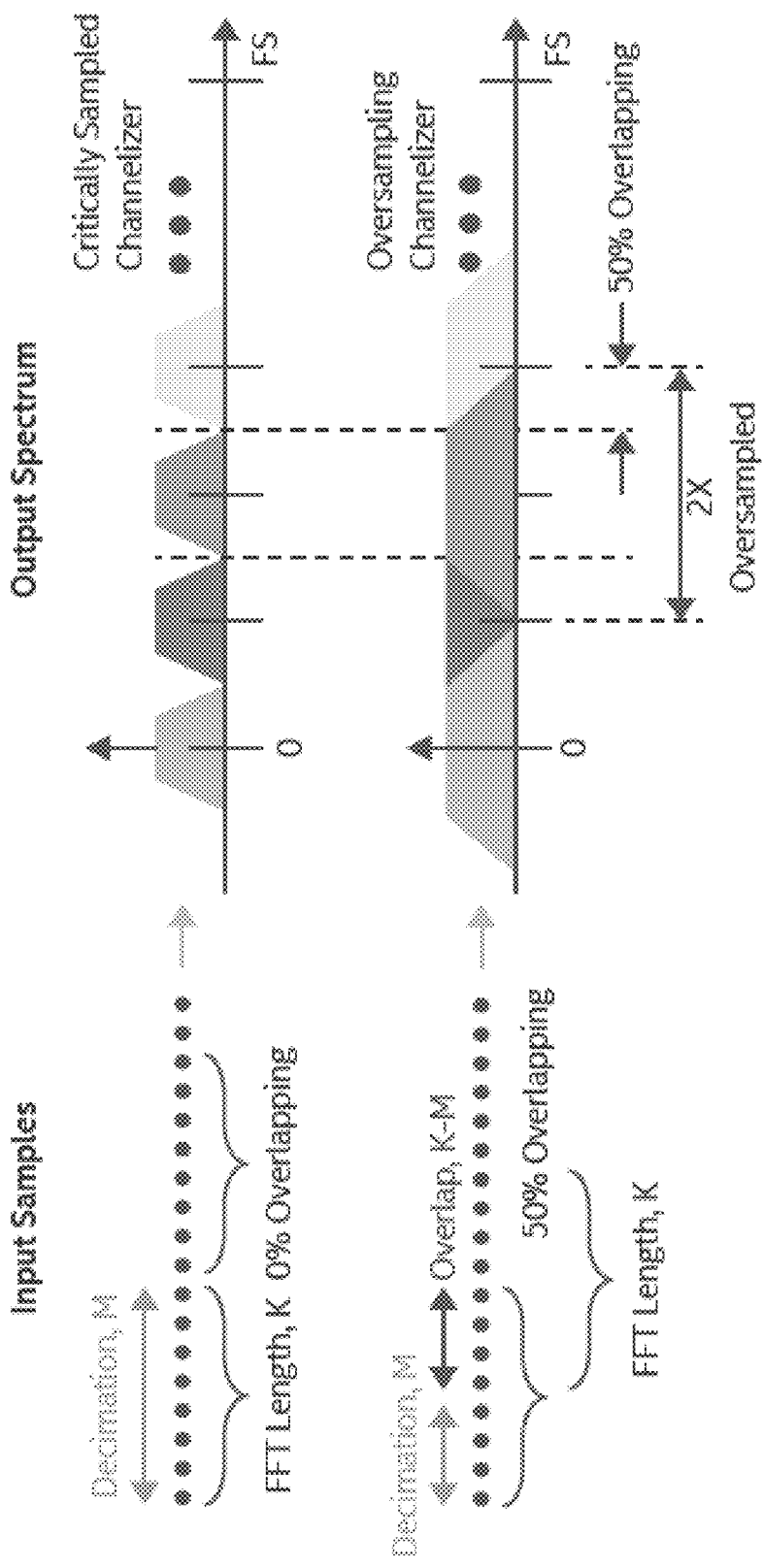
FIG. 4 illustrates the input/output relationships of an oversampling channelizer according to an exemplary embodiment of the present disclosure.

FIG. 4 illustrates the input/output relationships of an oversampling channelizer according to an exemplary embodiment of the present disclosure. There are variations of channelizers with different characteristics. The previously discussed channelizer is one where the bandwidth of each channel is exactly 1/K of the original signal spectrum. The output baseband is also decimated by K. It is possible to design a channelizer so that the bandwidth of each channel, 1/M, is larger than 1/K of the original spectrum. This would mean that the channel spectrum overlaps with its neighbors. This is a useful class of channelizer and may be referred to as an oversampling channelizer, overlapping channelizer, or weighted overlap and add (WOLA) structure. Let M be the channelizer decimation ratio between an input sample rate and output sample rate of a channel A critically sampled channelizer has M equals to K. An oversampling channelizer has M<K. FIG. 4 illustrates the effects of an oversampling channelizer by overlapping the input samples. The ratio K/M may be referred to as an oversampling ratio. For every M inputs, there are K outputs, one for each channel.

Figure 5:
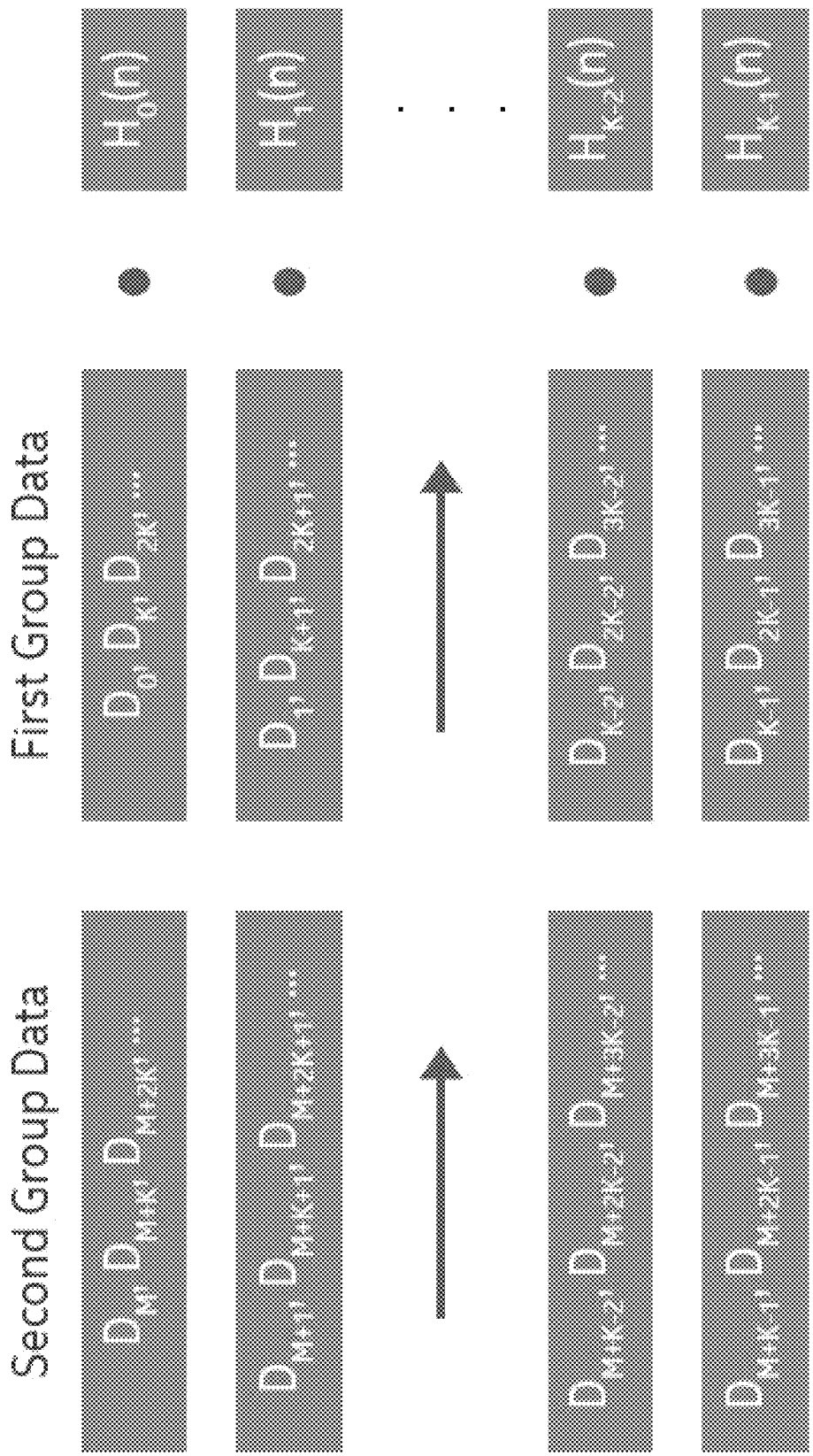
FIG. 5 illustrates a polyphase filter input data arrangement according to an exemplary embodiment of the present disclosure.

FIG. 5 illustrates a polyphase filter input data arrangement according to an exemplary embodiment of the present disclosure. To provide more output samples, inputs to the polyphase filter are increased accordingly. This is achieved by having the decimation rate M less than K. This results in an K−M overlapping input samples to the polyphase filter bank. FIG. 5 illustrates an arrangement of data feeding into corresponding subfilters for dot multiplications. Each column of group data represent a group of polyphase filter input data that generates one column (or K) outputs. Notice that there are M data samples apart between two successive groups of input data. Hence, the decimation rate is M. For example, if M=K/2, the successive polyphase filter bank inputs are only K/2 samples apart. The bottom half of the first data group overlaps with the top half of the second group. In such case, both the polyphase filter and FFT should work twice as fast to produce 2 times the output samples.

Figure 6:
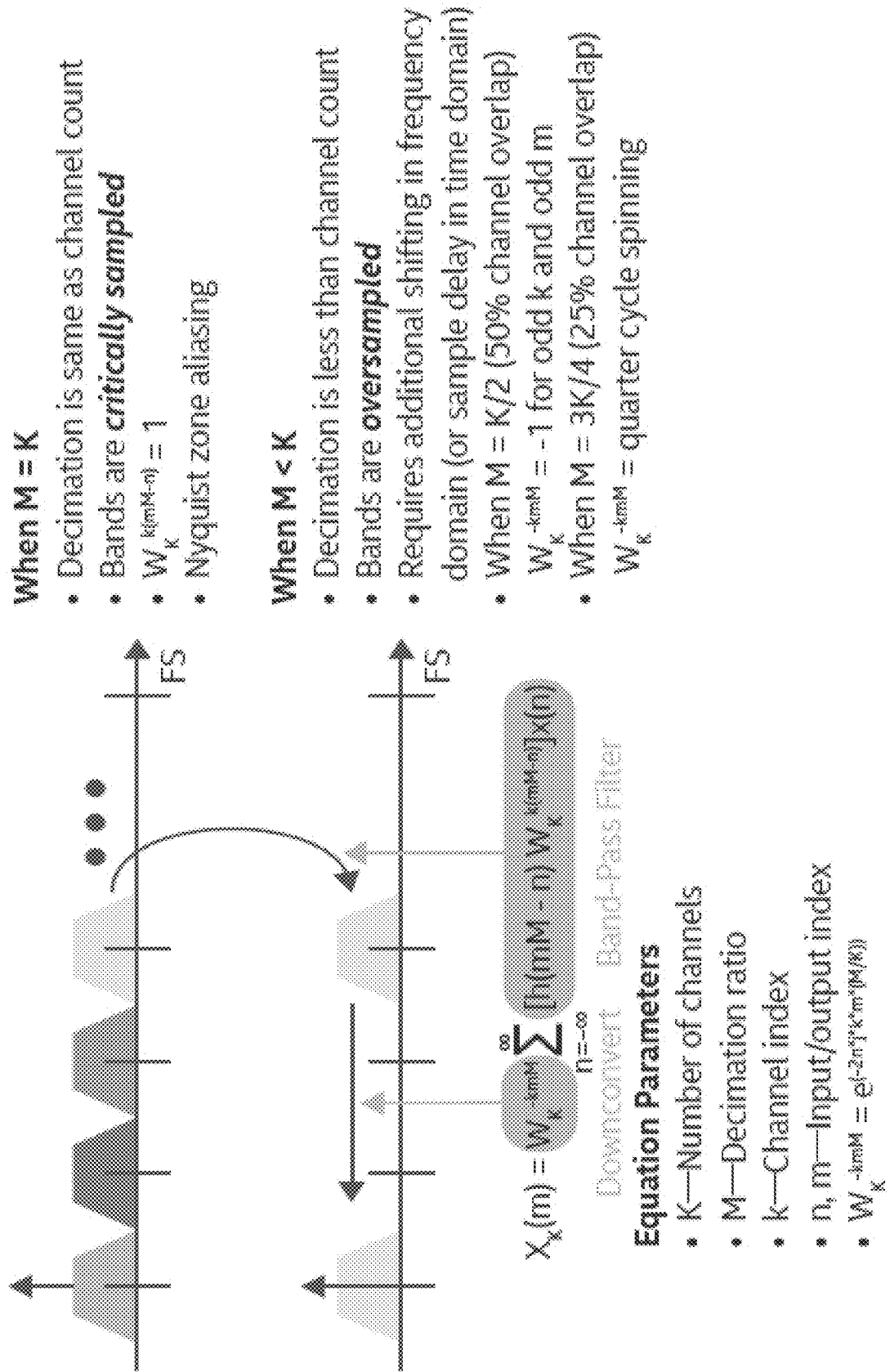
FIG. 6 illustrates channelizer characteristics corresponding to M and K relationships according to an embodiment of the present disclosure.

FIG. 6 illustrates channelizer characteristics corresponding to M and K relationships according to an embodiment of the present disclosure. There is an additional computation procedure to perform when M is not equal to K. The modulation term $W_K^{-kmM}$ becomes 1 when M=K, but evaluates to different values based on m and k, where m is an output index. This modulating term is applied after am FFT output in a polyphase filter bank implementation.

Figure 7:
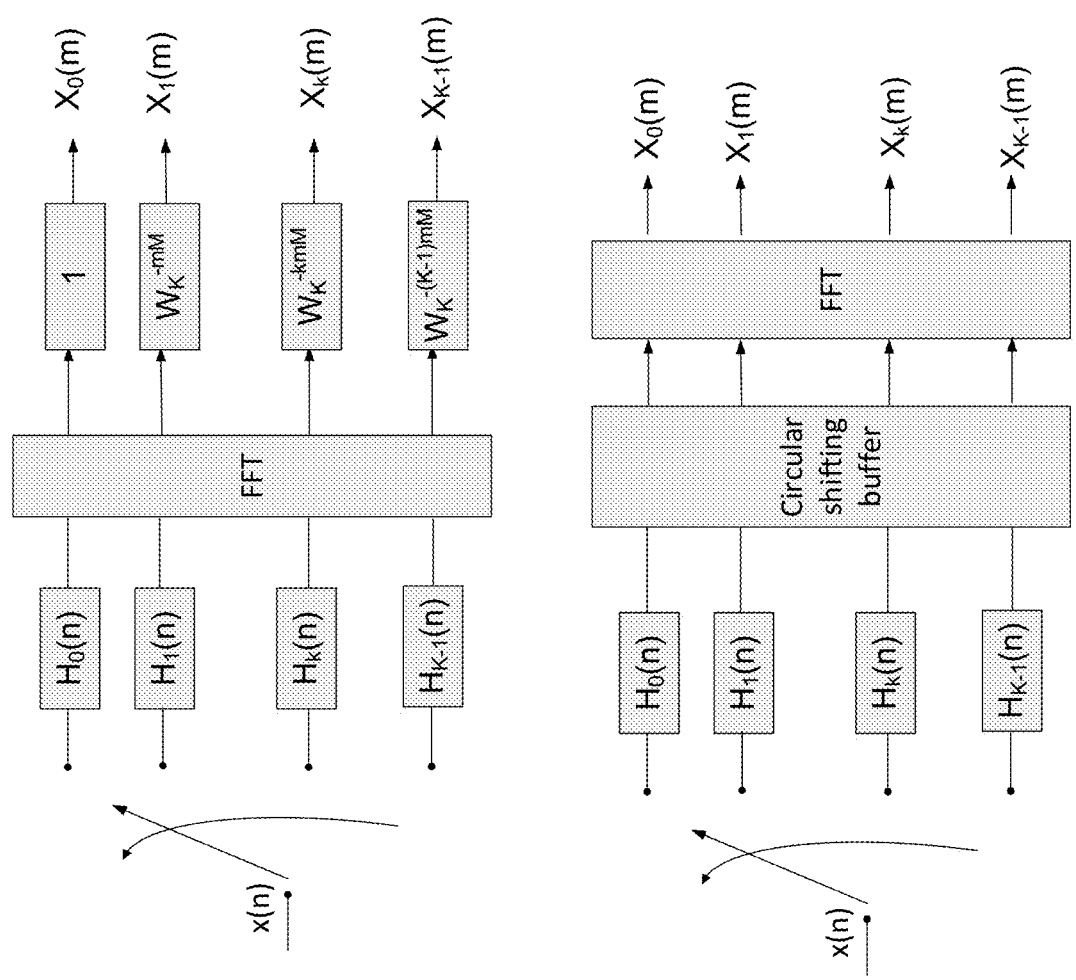
FIG. 7 illustrates oversampling channelizer structures according to an embodiment of the present disclosure.

FIG. 7 illustrates oversampling channelizer structures according to an embodiment of the present disclosure. The top portion of FIG. 7 illustrates a complete oversampling channelizing structure. The bottom portion of FIG. 7 illustrates an equivalent oversampling channelizer structure with a circular shifting buffer. An optimization that is achieved with the circular shifting is that modulation after FFT is the same as time delay (shifting input) before the FFT. For example, the K samples at the input of the circular shifting buffer is rotated by M additional samples for every frame. This reduces a number of required multipliers at the expense of buffering memory. However, this expense may be negligible if buffering memory can be shared for other reasons.

Figure 8:
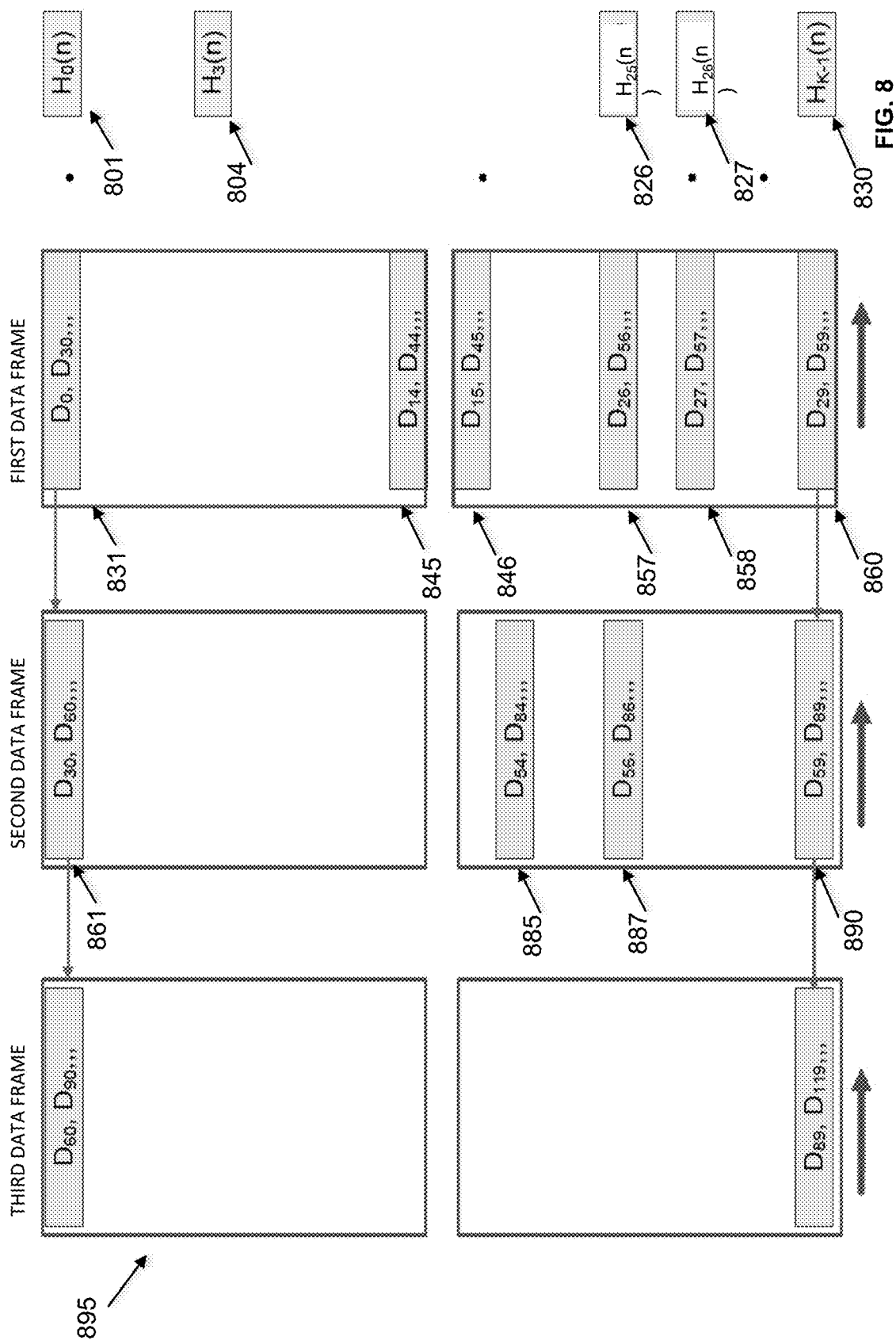
FIG. 8 illustrates a data arrangement of three input frames to a standard non-oversampling channelizer polyphase filter bank according to an exemplary embodiment of the present disclosure.

FIG. 8 illustrates a data arrangement of three input frames to a standard non-oversampling channelizer polyphase filter bank according to an exemplary embodiment of the present disclosure. The number of channels (data phases) in one FFT frame (FFT frame size) is represented by K, which is 30. The amount of decimation is represented by M, which is 30. The number of overlapping samples is K−M, which is 0. In this example, the number of parallel wires is a fraction of K, half of K, which is 15. Each frame is processed in 2 clocks. The column on the right illustrates corresponding coefficient vectors, H, of the polyphase filter bank. Each $H_x(n)$ contains "taps-per phase" number of coefficients. The total number of coefficients in a polyphase filter is K*number of taps-per phase. The number of taps-per-phase in this example is 27.

As illustrated in FIG. 8, coefficients in vectors $H_0(n)$–$H_{K-1}(n)$ 801-830 are multiplied with data values from a first data frame that includes 2 sub-frames of 15 paths 831-860. Each of the paths include a vector of data values. At a first clock cycle, 15 coefficient vectors, $H_0(n)$-$H_{14}(n)$ 801-815, are multiplied with 15 data vectors 831-845. At a second clock cycle, 15 coefficient vectors, $H_{15}(n)$-$H_{29}(0)$ 816-830, are multiplied with 15 data vectors 846-860.

Next, coefficients in vectors $H_0(n)$-$H_{K-1}(n)$ 801-830 are multiplied with data values from a second data frame that includes 2 sub-frames of 15 paths 861-890. At a third clock cycle, 15 coefficient vectors, $H_0(n)$-$H_{14}(n)$ 801-815, are multiplied with 15 data vectors 861-875. At a fourth clock cycle, 15 coefficient vectors, $H_{15}(n)$-$H_{29}(0)$ 816-830, are multiplied with 15 data vectors 876-890. Similarly, the coefficients in vectors $H_0(n)$-$H_{K-1}(n)$ 801-830 are multiplied with data values from a third data frame that includes 2 sub-frames of 15 paths 895. It should be noted that the same set of coefficients in vectors $H_0(n)$-$H_{K-1}(n)$ 801-830 are multiplied with each data frame, and that the data vectors change with each data frame. In this example, the first term in each data vector is replaced with the second term in the data vector from the previous frame. New incoming data is assigned to the last term for each data vector.

Programmable devices such as field programmable gate array (FPGA) provide an ideal processing platform for implementing polyphase filter banks which may be used in wideband communications, radar systems, and other applications. FPGA devices may include over 10,000 high-performance mathematical blocks, random access memory and programmable routing that enable the use of multiple processing pipes that execute in parallel while maintaining overall power consumption efficiency. Notice that by the indices of the data that the data are interleaved into different lanes and each lane of data and its corresponding coefficients forms a sub-filter, or a phase of a big filter, thus the name of polyphase filter. There is no interaction among phases of the polyphase filter bank. An FPGA having columns of memories, multipliers, and logic maps to the functionality of polyphase filter bank very well. The small and medium sized memory blocks in an FPGA may be used to store running data and coefficients. The multipliers can perform the multiplication of convolution. The logic elements can be configured to control the convolution mechanism and perform the summation in the convolution.

In an oversampling channelizer, input data from one frame to a next frame is overlapped. The data is overlapped in that part of the data processed in a previous frame is reused in a next frame. Processing overlapping data would be manageable if the overlapped data could be conveniently provided as memory output and read out by control logic as in the case of overlapping samples being a multiple of wire count. For example, when a number of channels or FFT frame size is 64, a number of parallel wires is 16, and the number of overlapping samples is 32, then the overlapping samples span 2 clocks. The 32 overlapping samples can be simply read out from the memory again at the beginning of next frame. The overlapping samples is therefore manipulated in time and is simple to implement. However, when the number of overlapping samples is a fraction of the number of parallel wires, the overlapping samples must be manipulated spatially. With the above example of 64 channels and 16 wires, if the number of overlapping samples are 8, the last 8 samples of the current frame have to be placed again at the beginning of the next frame. However, the last 8 samples reside at the highest order lanes in the last frame where the repeated 8 samples at the beginning of the next frame will be residing at the lower order lanes. This is referred to as spatial overlap. It should be noted that the oversampling channelizer handles not just one piece of data, but a vector of data in every phase of the polyphase filter. Additional logic is needed to swap the data from the higher order lanes to the lower order ones.

Figure 9:
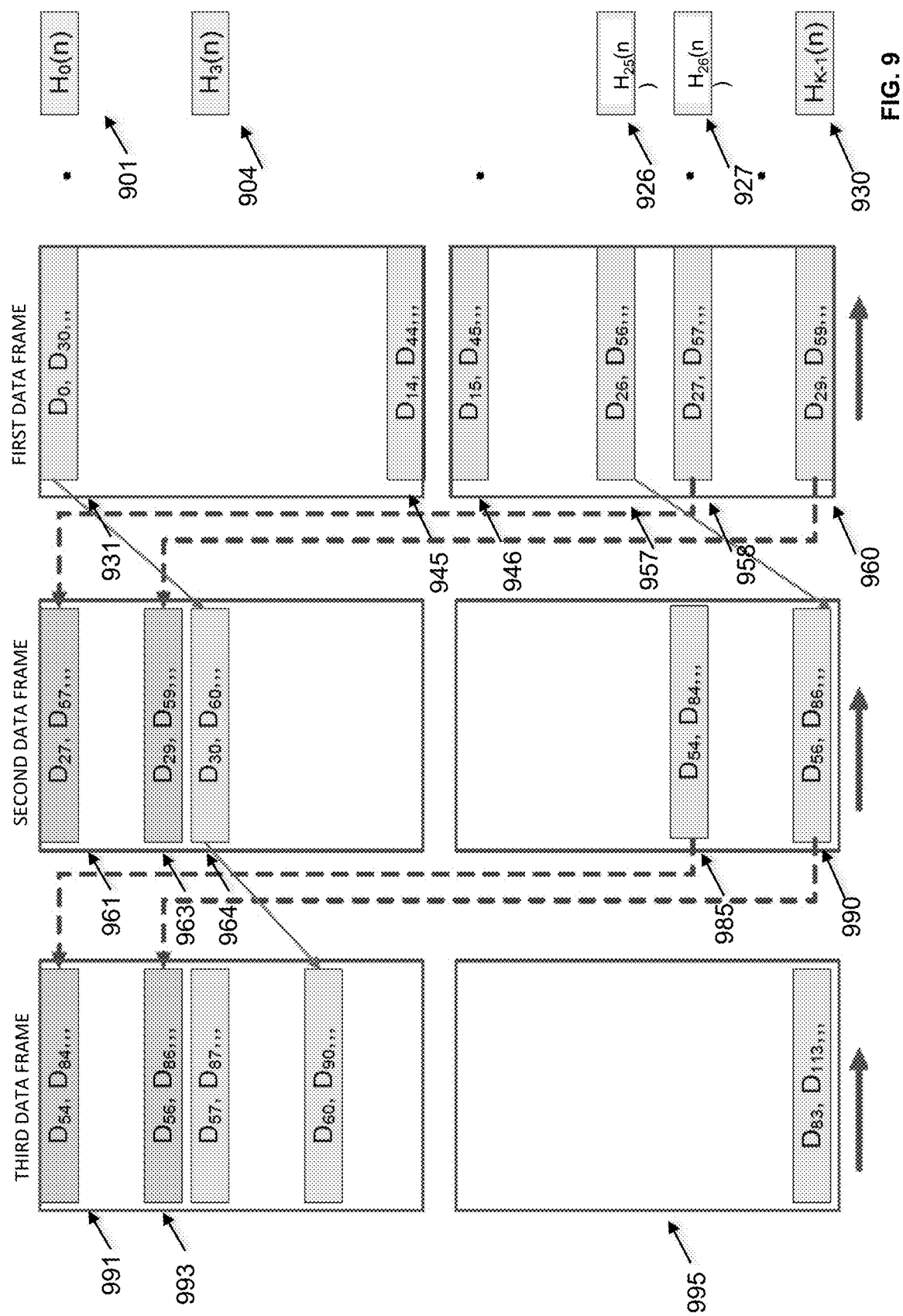
FIG. 9 illustrates a data arrangement of three input frames to an oversampling channelizer polyphase filter bank according to an exemplary embodiment of the present disclosure.

FIG. 9 illustrates a data arrangement of three input frames to an oversampling channelizer polyphase filter bank according to an exemplary embodiment of the present disclosure. The number of channels (data phases) in one FFT frame (FFT frame size) is represented by K, which is 30. The number of channels or data phases represents the number of parallel wires required to process the data arrangement. The amount of decimation is represented by M, which is 27. The number of overlapping samples is K–M, which is 3. In this example, the number of parallel wires is a fraction of K, half of K, which is 15. Each frame is processed in 2 clocks. The column on the right illustrates corresponding coefficient vectors, H, of the polyphase filter bank. Each Hx(n) contains "taps-per phase" number of coefficients. The total number of coefficients in a polyphase filter is K*number of taps-per phase. In this example, 30*27 equals 810 total number of coefficients.

As illustrated in FIG. 9, coefficients in vectors $H_0(n)$-$H_{K-1}(n)$ 901-930 are multiplied with data values from a first data frame that includes 2 sub-frames of 15 paths 931-960. Each of the paths include a vector of data. At a first clock cycle, 15 coefficient vectors, $H_0(n)$-$H_{14}(n)$ 901-915, are multiplied with 15 data vectors 931-945. At a second clock cycle, 15 coefficient vectors, $H_{15}(n)$-$H_{29}(0)$ 916-930, are multiplied with 15 data vectors 946-960.

Next, coefficients in vectors $H_0(n)$-$H_{K-1}(n)$ 901-930 are multiplied with data values from a second data frame that includes 2 sub-frames of 15 paths 961-990. At a third clock cycle, 15 coefficient vectors, $H_0(n)$-$H_{14}(n)$ 901-915, are multiplied with 15 data vectors 961-975. At a fourth clock cycle, 15 coefficient vectors, $H_{15}(n)$-$H_{29}(0)$ 916-930, are multiplied with 15 data vectors 976-990. Similarly, the coefficients in vectors $H_0(n)$-$H_{K-1}(n)$ 901-930 are multiplied with data values from a third data frame that includes 2 sub-frames of 15 paths 995. It should be noted that the same set of coefficients in vectors $H_0(n)$-$H_{K-1}(n)$ 901-930 are multiplied with each data frame. However, since there is overlapping input, where K–M=3, three of the data vectors for each frame are reused from a previous frame. In this example the data values in the last three data vectors in a data frame are used for the data values in the first three data vectors in a next data frame. For example, in FIG. 9, data vectors 961-963 in the second data frame include the same data values as data vectors 958-960 from the first data frame. Data vectors 991-993 from the third data frame include the same data values ad data vectors 988-990 from the second data frame. Each data vector that is not re-used is treated similarly to the data vectors in the non-overlapping example illustrated in FIG. 8. The first term in each data vector that is not reused is replaced with the second term in the data vector from the previous frame. New incoming data is assigned to the last term for each of these data vectors. The data vectors that are not reused are displaced in position in the next data frame by K–M places.

Figure 12:
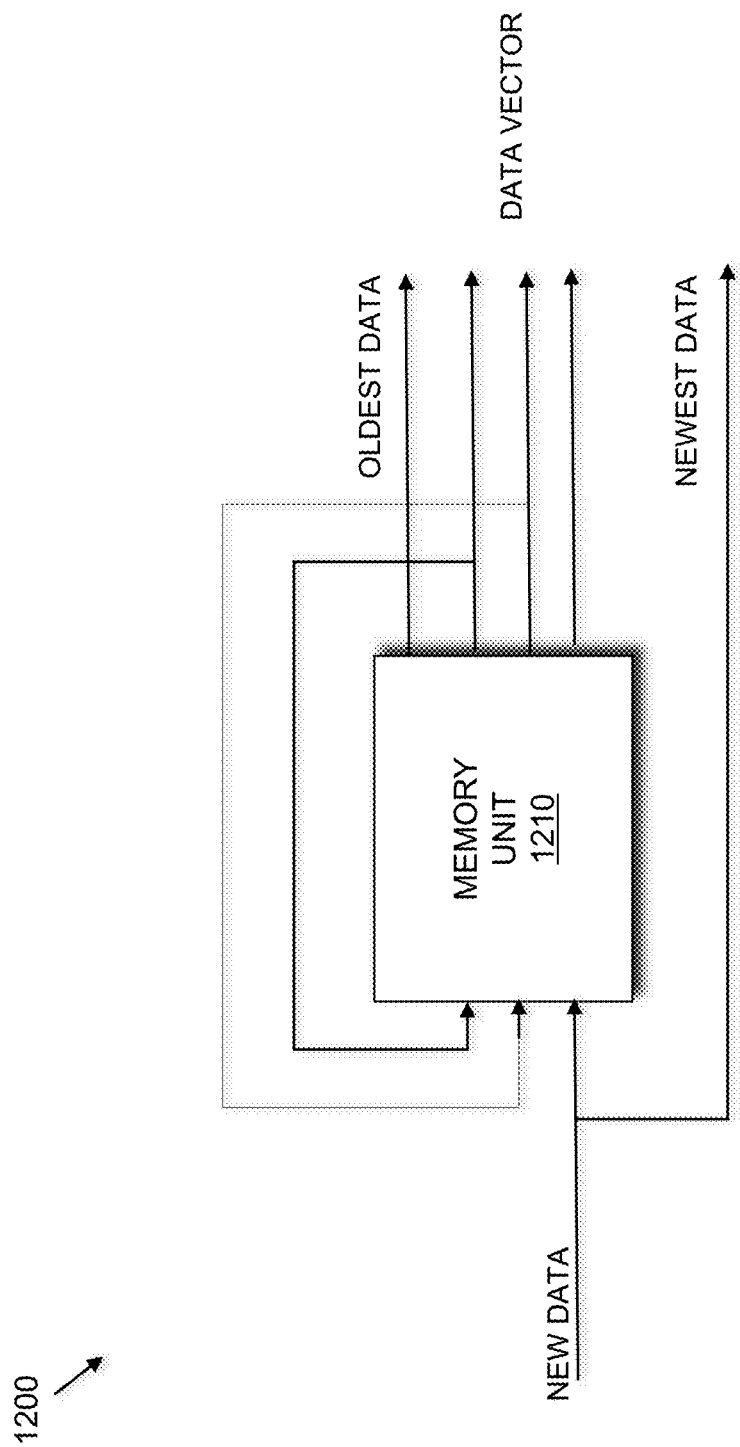
FIG. 12 illustrates a portion of a data storage unit according to an embodiment of the present disclosure.

The data arrangement illustrated in FIG. 9 which involves the manipulation of oversampling data over time which is inconsistent with the requirements of a data storage unit (data delay random access memory (RAM)) which requires that all data of a same phase must stay in a same lane. Wideband or high speed data are interleaved into fixed pattern of parallel lanes (or wires), regardless of applications, just as the interleaved data arrangement illustrated in the first frame of FIG. 8. The data in each lane does not cross to other lanes, again, regardless of the application. FIG. 12 illustrates one lane of a data storage unit (data delay RAM), which is a serial to parallel converter. FIG. 8 illustrates 30 of such single lanes. In order to workaround the requirement of having all data of a same phase stay in a same lane, a large barrel shifter may be implemented after the data delay RAM to rotate slices into the appropriate position. According to an embodiment of the present disclosure, a slice is K–M number of wires of data. Each slice would require 3 wires× 27 taps×16 bits×2 complex numbers which equals 2592-bits. This would require 25920 5 to 1 multiplexers. This poses a challenge for implementing the overlapping channelizer polyphase filter bank due to the amount of resources required, and satisfying timing requirements due to the additional routing of signals.

According to an embodiment of the present disclosure, instead of displacing (rotating) the data vectors as shown in FIG. 9, the data phases may be kept fixed and the coefficient phases are rotated. This may be achieved by storing all possible variations of the coefficient vectors associated with a (same) data phase. The polyphase filter bank phases follow that of the coefficient phases, and the polyphase filter bank output is rotated back in the other direction.

Figure 10:
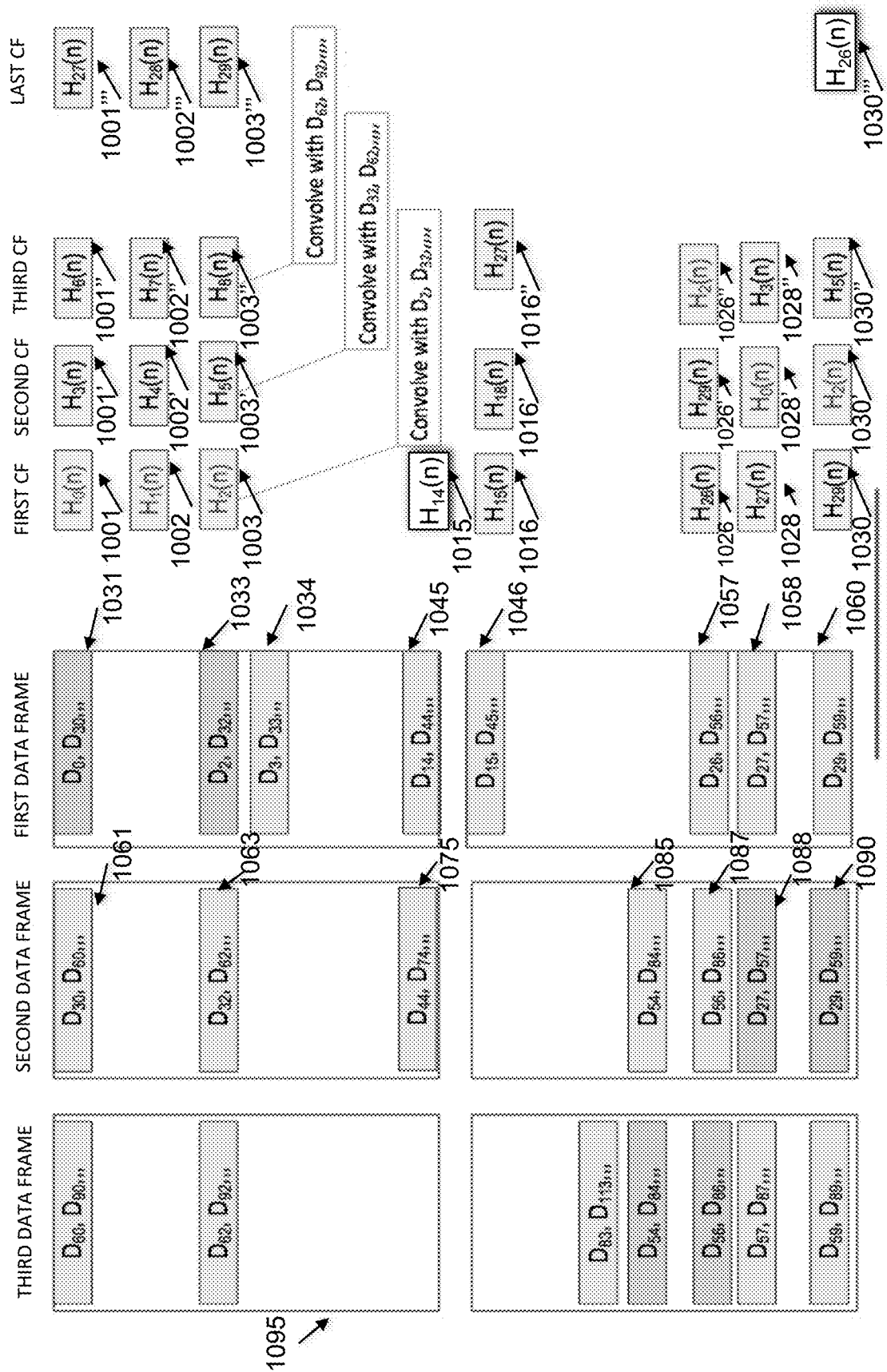
FIG. 10 illustrates a data arrangement of input frames to an oversampling channelizer polyphase filter bank with modifications to offset data phases according to an exemplary alternate embodiment of the present disclosure.

FIG. 10 illustrates a data arrangement of input frames to an oversampling channelizer polyphase filter bank with modifications to offset data phases according to an exemplary alternate embodiment of the present disclosure. Similar to the embodiment illustrated in FIG. 9, the number of channels (data phases) in one FFT frame (FFT frame size) is represented by K, which is 30. The amount of decimation is represented by M, which is 27. The number of overlapping samples is K-M, which is 3. In this example, the number of parallel wires is a fraction of K, half of K, which is 15. Each frame is processed in 2 clocks. The columns on the right illustrate corresponding coefficient vectors, H, of the polyphase filter bank for each frame. Each Hx(n) contains "taps-per phase" number of coefficients. The total number of coefficients in a polyphase filter is K*number of taps-per phase or 30*27 which equals 810 number of coefficients. Unlike the embodiment illustrated in FIG. 9, a different set of coefficient vectors are used during each phase and time frame.

As illustrated in FIG. 10, coefficients in coefficient vectors $H_0(n)$-$H_{K-1}(n)$ 1001-1030 in a first coefficient frame are multiplied with data values from a first data frame that includes 2 sub-frames of 15 paths 1031-1060. Each of the paths include a vector of data. At a first clock cycle, 15 coefficient vectors, $H_0(n)$-$H_{14}(n)$ 1001-1015, are multiplied with 15 data vectors 1031-1045. At a second clock cycle, 15 coefficient vectors, $H_{15}(n)$-$H_{29}(0)$ 1016-1030, are multiplied with 15 data vectors 1046-1060.

Next, coefficients in coefficient vectors $H_3(n)$-$H_{K-1}(n)$, and $H_0(n)$-$H_2(n)$ 1001'-1030' from a second coefficient frame are multiplied with data values from a second data frame that includes 2 sub-frames of 15 paths 1061-1090. At a third clock cycle, 15 coefficient vectors, $H_3(n)$-$H_{17}(n)$ 1001'-1015', are multiplied with 15 data vectors 1061-1075. At a fourth clock cycle, 15 coefficient vectors, $H_{18}(n)$-$H_{29}(n)$, and $H_0(n)$-$H_2(n)$ 1016'-1030', are multiplied with 15 data vectors 1076-1090. Similarly, the coefficients in coefficient vectors $H_6(n)$-$H_{29}(n)$, and $H_0(n)$-$H_5(n)$ 1001"-1030" from a third coefficient frame are multiplied with data values from a third data frame that includes 2 sub-frames of 15 paths 1095. This continues until coefficients in coefficient vectors $H_{27}(n)$-$H_{29}(n)$, and $H_0(n)$-$H_{26}(n)$ 1001'''-1030''' from a last coefficient frame are multiplied with data values from a last data frame that includes 2 sub-frames of 15 paths (not shown).

It should be noted that by displacing (rotating) the coefficient vectors every coefficient frame, data paths (data phases) may remain fixed. Coefficient vectors $H_0(n)$-$H_2(n)$ always convolve with reused data vectors from the data frames. After completing the multiplication of coefficients from coefficient vectors with data values from the data vectors, the dot products are rotated back. According to an embodiment of the present disclosure, the dot product output of each successive frame in FIG. 10 is rotated by K-M, which is 3 in this example, to generate a result that is equivalent to the results shown in FIG. 9. According to an embodiment of the present disclosure, FFT oversampling modulation may also be performed. Oversampling modulation is illustrated in FIG. 7 with the term $W_K^{-kmM}$. It should be appreciated that oversampling correction may also be achieved by circular shifting successive frames by M. Rotating by M in one direction is equivalent to rotating by K−M in the other direction.

Instead of displacing (rotating) the data vectors as shown in FIG. 9, the data phases are kept fixed and the coefficient phases are rotated as shown in FIG. 10. This may be achieved by storing all possible variations of the coefficient vectors associated with a (same) data phase. The polyphase filter bank phases follow that of the coefficient phases, and the polyphase filter bank output is rotated back in the other direction. This reduces the hardware required for implementing the oversampling channelizer. This is an improvement in the technical field of oversampling channelizers and provides a technical advantage.

Figure 11:
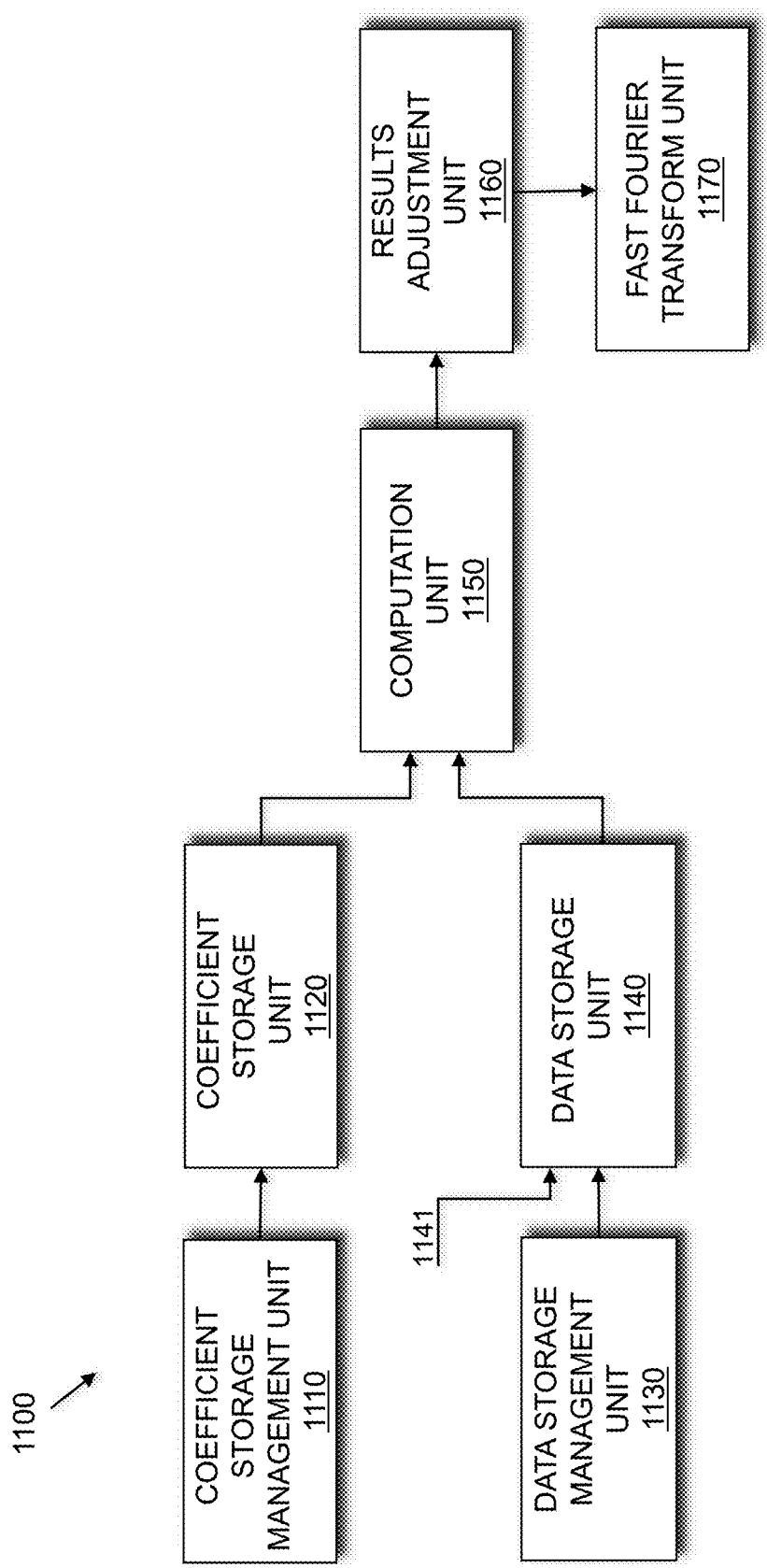
FIG. 11 illustrates a block diagram of an oversampling channelizer according to an embodiment of the present disclosure.

FIG. 11 illustrates a block diagram of an oversampling channelizer 1100 according to an embodiment of the present disclosure. The oversampling channelizer 1100 may be used to process overlapping data such as that illustrated in FIG. 10. The oversampling channelizer 1100 includes a data storage unit 1140. The data storage unit 1140 is coupled to a data line 1141 that receives data values. According to an embodiment of the present disclosure, the data storage unit 1140 includes a plurality of lanes. Each of the plurality of lanes includes dedicated memory locations that store data values and dedicated wires that transmit the data values. The dedicated memory locations are also used to store additional data values for a subsequent data vector of a subsequent data frame that includes a plurality of data values from the data vector in the (prior) data frame. According to an embodiment of the present disclosure, a number of data vectors in each data frame, K, minus a decimation for each data frame, M, is less than a number of the plurality of lanes in the data storage unit 1141.

The oversampling channelizer 1100 includes a data storage management unit 1130. The data storage management unit 1130 selects whether to have the data storage unit 1140 generate the subsequent data vector by adding a new data value and removing an oldest data value in the data vector or by reusing all of the data values from the data vector.

The oversampling channelizer 1100 includes a coefficient storage unit 1120. The coefficient storage unit 1120 stores a plurality of coefficient vectors. According to an embodiment of the present disclosure, the coefficient storage unit 1120 stores coefficient vectors for a plurality of coefficient frames where each coefficient frame includes a unique order arrangement of coefficient vectors. According to an embodiment of the present disclosure, there are K coefficient vectors in a coefficient frame. There are also K number of phases in a polyphase filter bank and in a fast Fourier transform unit. According to an embodiment of the present disclosure, the number of coefficient frames that are stored in the coefficient storage unit 1120 is K/(k−M).

The oversampling channelizer 1100 includes a coefficient storage management unit 1110. The coefficient storage management unit 1110 selects the coefficient frame to reflect a rotation of coefficient vectors. According to an embodiment of the present disclosure, the rotation of coefficient vectors between successive frames follows the rotation of the successive data frames.

The oversampling channelizer 1100 includes a computation unit 1150. The computation unit 1150 is coupled to the coefficient storage unit 1120 and the data storage unit 1140. The computation unit 1150 receives coefficient frames from the coefficient storage unit 1120 and data frames from the data storage unit 1140. According to an embodiment of the present disclosure, the computation unit 1100 computes a dot product of data values for the data vector of the data frame with coefficient values for coefficient vectors of coefficient frame selected by the coefficient storage management unit 1110.

The oversampling channelizer 1100 includes a results adjustment unit 1160. According to an embodiment of the present disclosure, the results adjustment unit 1160 rotates the dot product generated by the computation unit 1150. According to an embodiment of the present disclosure, the dot product output of each successive frame generated at computation unit 1150 is rotated by K-M to generate a result that is equivalent to the results shown in FIG. 9. According to an embodiment of the present disclosure, FFT oversampling modulation may also be performed. Oversampling modulation is illustrated in FIG. 7 with the term $W_K^{-kmM}$. It should be appreciated that oversampling correction may also be achieved by circular shifting successive frames by M. Rotating by M in one direction is equivalent to rotating by K−M in the other direction.

The oversampling channelizer 1100 includes a fast Fourier transform unit 1170. According to an embodiment of the present disclosure, the fast Fourier transform unit 1170 performs a fast Fourier transform procedure on the adjusted dot product from the results adjustment unit 1160. According to an embodiment of the present disclosure the fast Fourier transform unit 1170 modulates all the polyphase filter bank phase outputs from results adjustment unit 1160 into individual base band signals. It should be appreciated that the coefficient storage management unit 1110, coefficient storage unit 1120, data storage management unit 1130, data storage unit 1140, computation unit 1150, and results adjustment unit 1160 implement a polyphase filter bank.

FIG. 12 illustrates a portion of a data storage unit 1200 according to an embodiment of the present disclosure. The portion of the data storage unit 1200 includes a single data lane. The single data lane includes a memory unit 1210 that may be implemented by delays, memory or a plurality of memory locations, registers, or other memory component. In the embodiment illustrated, the single lane receives a plurality of new data where one new data value is received for every N clock cycles. Each new data value circulates through the memory unit 1210 to form a data vector. The data vector in this example is formed after 4N clock cycles and includes 4 data values.

Figure 13:
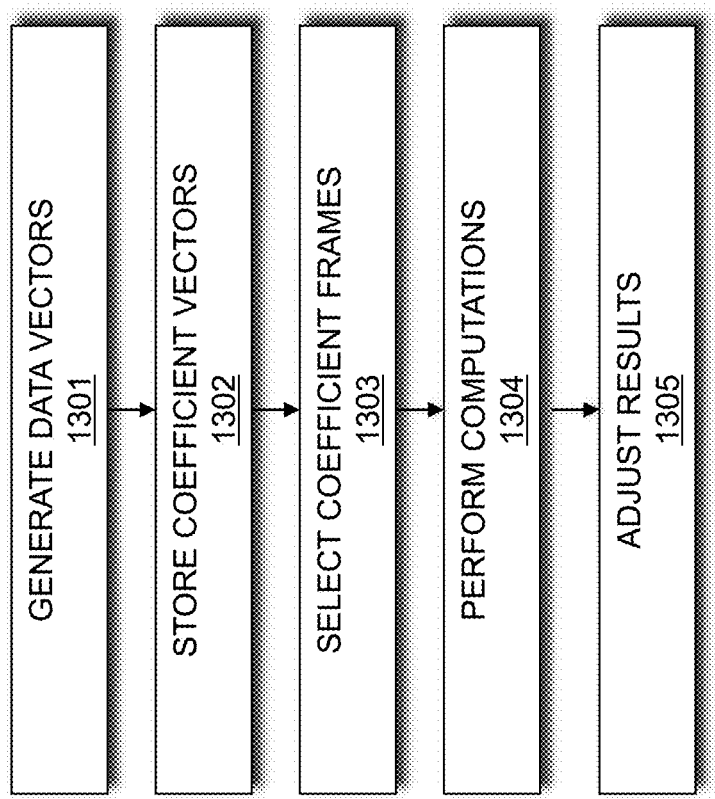
FIG. 13 is a flow chart illustrating a method for managing overlapping data in an oversampling channelizer according to an embodiment of the present disclosure.

FIG. 13 is a flow chart illustrating a method for managing overlapping data in an oversampling channelizer according to an embodiment of the present disclosure. At 1301, a plurality of data vectors are generated for a plurality of data frames with incoming data values. According to an embodiment of the present disclosure, data vectors that include data values from a data vector from a previous data frame are generated from a same lane that includes a dedicated memory and wires that store and transmit the data values from the data vector from the previous data frame. In one embodiment, a number of data vectors in each data frame, K, minus decimation for each data frame, M, is less than a number of the plurality of lanes in the data storage unit.

At 1302, a plurality of coefficient vectors are stored for a plurality of coefficient frames. According to an embodiment of the present disclosure, each of the plurality of coefficient frames includes a unique order arrangement of coefficient vectors.

At 1303, coefficient frames from the plurality of coefficient frames are selected to perform computations with data frames of the plurality of data frames. According to an embodiment of the present disclosure, the appropriate coefficient frames are selected in response to channelizing protocol for overlapping data. By selecting coefficient frames with stored coefficient vectors to perform computations with data frames, control effectuates the rotation of coefficient values instead of the rotation of data values. This reduces the hardware required for implementing the oversampling channelizer. This is an improvement in the technical field of oversampling channelizers and provides a technical advantage. FIG. 2 illustrates how the coefficients of a low pass filter are interleaved into phases of coefficient vectors. FIGS. 8, 9, 10 illustrate how data is interleaved to form data vectors and illustrate the relationship between the data and the coefficient vectors.

At 1304, computations are performed between the data values of data vectors from the data frames and coefficient values of coefficient vectors from the selected coefficient frames. According to an embodiment of the present disclosure, the data vectors and the coefficient vectors are convolved to compute a dot product.

At 1305, the results from the computations are adjusted. According to an embodiment of the present disclosure, the adjustment includes rotating the dot product of the data values for the data vectors of the data frames with the coefficient values for the coefficient vectors of the selected coefficient frames.

FIG. 13 is a flow chart that illustrates an embodiment of the present disclosure. The procedures described in may be performed by an oversampling channelizer. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 14:
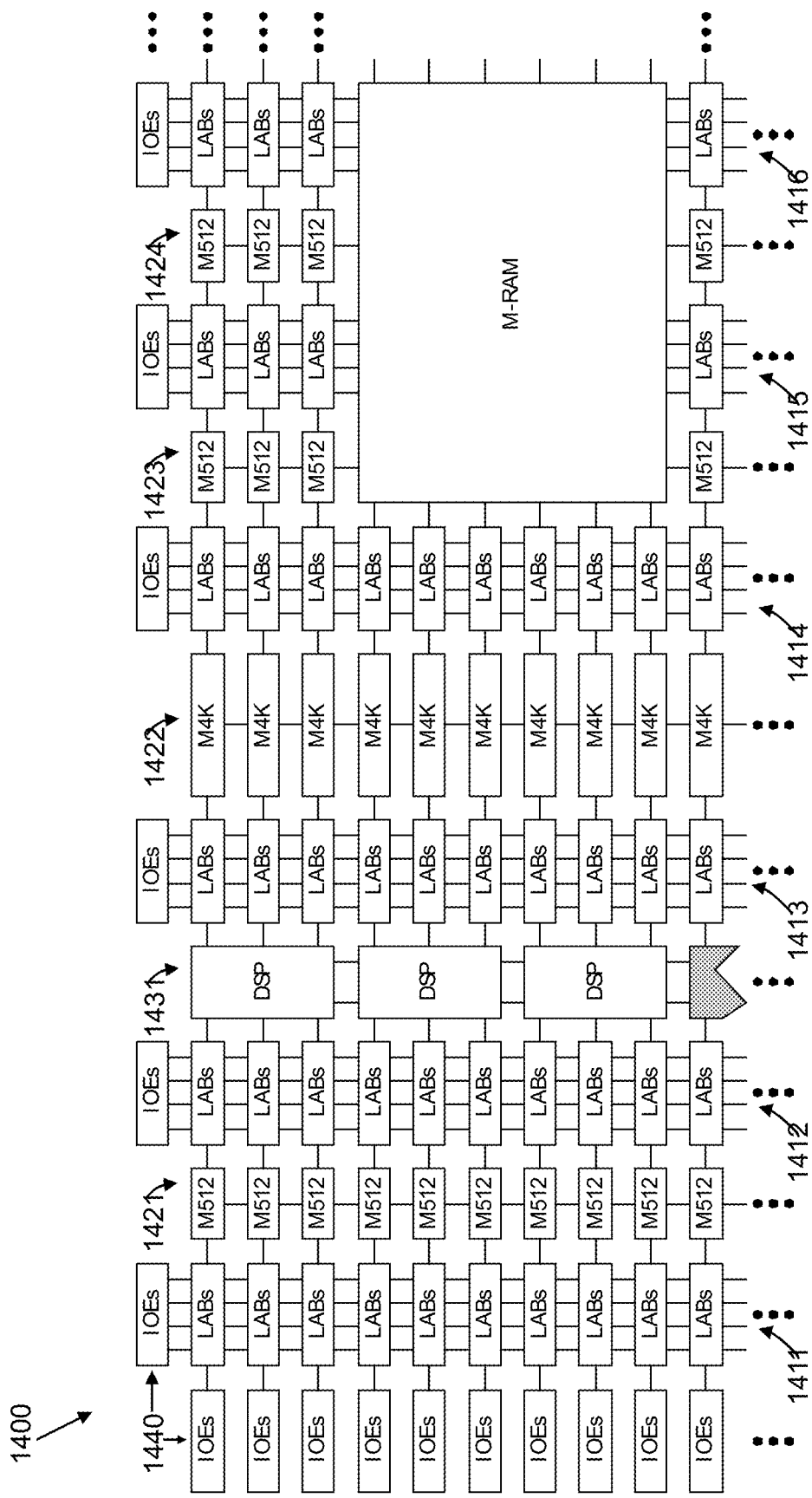
FIG. 14 illustrates an exemplary target device according to an exemplary embodiment of the present disclosure.

FIG. 14 illustrates an exemplary target device according to an exemplary embodiment of the present disclosure. The target device 1400 is a field programmable gate array (FPGA) that includes a plurality of logic-array blocks (LABs). According to an embodiment of the present disclosure, the target device 1400 may be implemented on a single integrated circuit. Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present disclosure, the logic block may operate similarly to a logic element (LE), such as those found in the Stratix or Cyclone devices manufactured by Altera® Corporation, which is wholly owned by Intel Corporation, or a combinational logic block (CLB) such as those found in Virtex devices manufactured by Xilinx Inc. In this embodiment, the logic block may include a four input LUT with a configurable register. According to an embodiment of the present disclosure, the logic block may be implemented by an adaptive logic module (ALM), such as those found in Stratix devices. LABs are grouped into rows and columns across the target device 1400. Columns of LABs are shown as 1411-1416. It should be appreciated that the logic block may include additional or alternate components. It should be appreciated that a carry chain may be implemented with the resources of one or more LABs in the target device 1400.

The target device 1400 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1400. Columns of memory blocks are shown as 1421-1424. It should be appreciated that the memory blocks 1421-1424 may include 640-bit memory, 20 K-bit memory, or other size memory.

The target device 1400 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1400 and are shown as 1431.

The target device 1400 includes a plurality of input/output elements (IOEs) 1440. Each IOE feeds an IO pin (not shown) on the device 1400. The IOEs 1440 are located at the end of LAB rows and columns around the periphery of the device 1400. Each IOE may include a bidirectional IO buffer and a plurality of registers for registering input, output, and output-enable signals.

The target device 1400 may include routing resources such as LAB local interconnect lines, row interconnect lines ("H-type wires"), and column interconnect lines ("V-type wires") (not shown) to route signals between components on the target device.

It should be appreciated that the oversampling channelizer 1100 illustrated in FIG. 11 may be implemented with the programmable resources illustrated in FIG. 14. According to an embodiment of the present disclosure, the data storage unit 1140 may be implemented by registers in the LABs 1411-1416 and by the memory blocks 1421-1424. The coefficients storage unit 1210 may be implemented by the memory blocks 1421-1424. The coefficient storage management unit 1110 and data storage management unit 1130 may be implemented by LABs 1411-1416. The computation unit 1150 may be implemented in part by the DSP blocks 1431 to perform multiplications, and implemented in part by LABs 1411-1416 to perform the summation of the dot product. The circular shift in the results adjustment unit 1160 may be implemented by the memory blocks 1421-1424. The fast Fourier transform unit 1170 may be implemented by the memory blocks 1421-1424, the DSP blocks 1431 and the LABs 1411-1416.

The following examples pertain to further embodiments. In one embodiment, an oversampling channelizer for processing overlapping data includes a data storage unit, coupled to a data line that receives data values, that includes a plurality of lanes, wherein each of the plurality of lanes includes dedicated memory locations and wires that store and transmit data values for a data vector of a data frame, and that store and transmit additional data values for a subsequent data vector of a subsequent data frame that includes a plurality of the data values from the data vector in the data frame. The oversampling channelizer includes a coefficient storage unit that stores a plurality of coefficient vectors for a plurality of coefficient frames. The oversampling channelizer includes a computation unit that computes a dot product of the data values for the data vectors of the data frame with coefficient values for coefficient vectors of a coefficient frame selected by a coefficient storage management unit.

In a further embodiment, the oversampling channelizer wherein the computation unit further computes a dot product of the additional data values for the subsequent data vectors of the subsequent data frame with additional coefficient values for coefficient vectors of a subsequent coefficient frame selected by the coefficient storage unit.

In a further embodiment, the oversampling channelizer wherein a number of data vectors in each data frame minus a decimation for each data frame is less than a number of the plurality of lanes in the data storage unit.

In a further embodiment, the oversampling channelizer wherein each of the plurality of coefficient frames includes a unique order arrangement of coefficient vectors.

In a further embodiment, the oversampling channelizer further comprising a coefficient storage management unit that selects the coefficient frame to reflect a rotation of coefficient vectors.

In a further embodiment, the oversampling channelizer further comprising a data storage management unit that selects whether to generate the subsequent data vector by adding a new data value and removing an oldest data value in the data vector or by reusing all of the data values from the data vector.

In a further embodiment, the oversampling channelizer further comprising a results adjustment unit that rotates the dot product generated by the computation unit to generate an adjusted dot product.

In a further embodiment, the oversampling channelizer further comprising a fast Fourier transform (FFT) unit that performs a FFT procedure on the adjusted dot product.

In a further embodiment, the oversampling channelizer wherein the oversampling channelizer is implemented on a field programmable gate array.

In a further embodiment, an oversampling channelizer for processing overlapping data, includes a data storage unit, coupled to a data line that receives data values, that includes a plurality of lanes, wherein each of the plurality of lanes includes dedicated memory locations and wires that store and transmit data values for a data vector of a data frame, and that store and transmit additional data values for a subsequent data vector of a subsequent data frame that includes a plurality of the data values from the data vector in the data frame, wherein a number of data vectors in each data frame minus a decimation for each data frame is less than a number of the plurality of lanes in the data storage unit. The oversampling channelizer includes a coefficient storage unit that stores a plurality of coefficient vectors for a plurality of coefficient frames, wherein each of the plurality of coefficient frames includes a unique order arrangement of coefficient vectors. The oversampling channelizer includes a computation unit that computes a dot product of the data values for the data vectors of the data frame with coefficient values for coefficient vectors of a coefficient frame selected by a coefficient storage management unit, wherein the oversampling channelizer is implemented on a field programmable gate array.

In a further embodiment, the oversampling channelizer wherein the computation unit further computes a dot product of the additional data values for the subsequent data vectors of the subsequent data frame with additional coefficient values for coefficient vectors of a subsequent coefficient frame selected by the coefficient storage unit.

In a further embodiment, the oversampling channelizer further comprises a coefficient storage management unit that selects the coefficient frame to reflect a rotation of coefficient vectors.

In a further embodiment, the oversampling channelizer further comprises a data storage management unit that selects whether to generate the subsequent data vector by adding a new data value and removing an oldest data value in the data vector or by reusing all of the data values from the data vector.

In a further embodiment, the oversampling channelizer further comprises a results adjustment unit that rotates the dot product generated by the computation unit to generate an adjusted dot product.

In a further embodiment, a method for managing overlapping data in an oversampling channelizer includes generating a plurality of data vectors for a plurality of data frames with incoming data values, wherein data vectors that include data values from a data vector from a previous data frame are generated from a same lane that includes a dedicated memory and wires that store and transmit the data values from the data vector from the previous data frame. A plurality of coefficient vectors for a plurality of coefficient frames is stored. A coefficient frame is selected from the plurality of coefficient frames to perform a dot product computation with a first data frame of the plurality of data frames. A dot product of data values for data vectors of the first data frame with coefficient values for coefficient vectors of the selected coefficient frame is computed.

In a further embodiment, the method further includes selecting a subsequent coefficient frame from the plurality of coefficient frames to perform a dot product computation with a second data frame of the plurality of data frames, and computing a dot product of additional data values for additional data vectors of the second data frame with additional coefficient values for additional coefficient vectors of the selected subsequent coefficient frame.

In a further embodiment, the method wherein a number of data vectors in each data frame minus a decimation for each data frame is less than a number of the plurality of lanes in the data storage unit.

In a further embodiment, the method wherein each of the plurality of coefficient frames includes a unique order arrangement of coefficient vectors.

In a further embodiment, the method wherein generating the plurality of data vectors for the plurality of data frames comprises selecting whether to generate a data vector by adding a new data value to and removing an oldest data value from a previous data vector or by reusing all of the data values from the previous data vector.

In a further embodiment, the method further includes rotating the dot product of the data values for the data vectors of the first data frame with the coefficient values for the coefficient vectors of the selected coefficient frame.

In the foregoing specification, embodiments of the disclosure have been described with reference to specific exemplary embodiments thereof. It will, however, be evident that various modifications and changes may be made thereto without departing from the broader spirit and scope of the embodiments of the disclosure. The specification and drawings are, accordingly, to be regarded in an illustrative rather than restrictive sense.

What is claimed is:

1. An oversampling channelizer for processing overlapping data, comprising:
 a data storage unit, coupled to a data line that receives data values, that includes a plurality of lanes, wherein each of the plurality of lanes includes dedicated memory locations and wires that store and transmit data values for a data vector of a data frame, and that store and transmit additional data values for a subsequent data vector of a subsequent data frame that includes a plurality of the data values from the data vector in the data frame;
 a coefficient storage unit that stores a plurality of coefficient vectors for a plurality of coefficient frames; and
 a computation unit that computes a dot product of the data values for the data vectors of the data frame with coefficient values for coefficient vectors of a coefficient frame selected by a coefficient storage management unit.

2. The apparatus of claim 1, wherein the computation unit further computes a dot product of the additional data values for the subsequent data vectors of the subsequent data frame with additional coefficient values for coefficient vectors of a subsequent coefficient frame selected by the coefficient storage unit.

3. The apparatus of claim 1, wherein a number of data vectors in each data frame minus a decimation for each data frame is less than a number of the plurality of lanes in the data storage unit.

4. The apparatus of claim 1, wherein each of the plurality of coefficient frames includes a unique order arrangement of coefficient vectors.

5. The apparatus of claim 1, further comprising a coefficient storage management unit that selects the coefficient frame to reflect a rotation of coefficient vectors.

6. The apparatus of claim 1 further comprising a data storage management unit that selects whether to generate the subsequent data vector by adding a new data value and removing an oldest data value in the data vector or by reusing all of the data values from the data vector.

7. The apparatus of claim 1 further comprising a results adjustment unit that rotates the dot product generated by the computation unit to generate an adjusted dot product.

8. The apparatus of claim 7 further comprising a fast Fourier transform (FFT) unit that performs a FFT procedure on the adjusted dot product.

9. The apparatus of claim 1, wherein the oversampling channelizer is implemented on a field programmable gate array.

10. An oversampling channelizer for processing overlapping data, comprising:
 a data storage unit, coupled to a data line that receives data values, that includes a plurality of lanes, wherein each of the plurality of lanes includes dedicated memory locations and wires that store and transmit data values for a data vector of a data frame, and that store and transmit additional data values for a subsequent data vector of a subsequent data frame that includes a plurality of the data values from the data vector in the data frame, wherein a number of data vectors in each data frame minus a decimation for each data frame is less than a number of the plurality of lanes in the data storage unit;
 a coefficient storage unit that stores a plurality of coefficient vectors for a plurality of coefficient frames, wherein each of the plurality of coefficient frames includes a unique order arrangement of coefficient vectors; and
 a computation unit that computes a dot product of the data values for the data vectors of the data frame with coefficient values for coefficient vectors of a coefficient frame selected by a coefficient storage management unit, wherein the oversampling channelizer is implemented on a field programmable gate array.

11. The apparatus of claim 10, wherein the computation unit further computes a dot product of the additional data values for the subsequent data vectors of the subsequent data frame with additional coefficient values for coefficient vectors of a subsequent coefficient frame selected by the coefficient storage unit.

12. The apparatus of claim 10, further comprising a coefficient storage management unit that selects the coefficient frame to reflect a rotation of coefficient vectors.

13. The apparatus of claim 10 further comprising a data storage management unit that selects whether to generate the subsequent data vector by adding a new data value and removing an oldest data value in the data vector or by reusing all of the data values from the data vector.

14. The apparatus of claim 10 further comprising a results adjustment unit that rotates the dot product generated by the computation unit to generate an adjusted dot product.

15. A method for managing overlapping data in an over-sampling channelizer, comprising:
generating a plurality of data vectors for a plurality of data frames with incoming data values, wherein data vectors that include data values from a data vector from a previous data frame are generated from a same lane that includes a dedicated memory and wires that store and transmit the data values from the data vector from the previous data frame;
storing a plurality of coefficient vectors for a plurality of coefficient frames;
selecting a coefficient frame from the plurality of coefficient frames to perform a dot product computation with a first data frame of the plurality of data frames; and
computing a dot product of data values for data vectors of the first data frame with coefficient values for coefficient vectors of the selected coefficient frame.

16. The method of claim 15 further comprising:
selecting a subsequent coefficient frame from the plurality of coefficient frames to perform a dot product computation with a second data frame of the plurality of data frames;
computing a dot product of additional data values for additional data vectors of the second data frame with additional coefficient values for additional coefficient vectors of the selected subsequent coefficient frame.

17. The method of claim 15, wherein a number of data vectors in each data frame minus a decimation for each data frame is less than a number of the plurality of lanes in the data storage unit.

18. The method of claim 15, wherein each of the plurality of coefficient frames includes a unique order arrangement of coefficient vectors.

19. The method of claim 15, wherein generating the plurality of data vectors for the plurality of data frames comprises selecting whether to generate a data vector by adding a new data value to and removing an oldest data value from a previous data vector or by reusing all of the data values from the previous data vector.

20. The method of claim 15 further comprising rotating the dot product of the data values for the data vectors of the first data frame with the coefficient values for the coefficient vectors of the selected coefficient frame.

* * * * *